(12) United States Patent
Hsieh

(10) Patent No.: US 7,274,254 B2
(45) Date of Patent: Sep. 25, 2007

(54) DEVICE AND METHOD FOR ENHANCING OUTPUT CURRENT DRIVING

(75) Inventor: Jin-Sheng Hsieh, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 161 days.

(21) Appl. No.: 11/160,822

(22) Filed: Jul. 12, 2005

(65) Prior Publication Data

US 2006/0197591 A1    Sep. 7, 2006

(30) Foreign Application Priority Data

Mar. 3, 2005  (TW) .............................. 94106399 A

(51) Int. Cl.
*H03F 1/14* (2006.01)
(52) U.S. Cl. ........................................ 330/51; 327/112
(58) Field of Classification Search ................ 330/255, 330/51; 327/112
See application file for complete search history.

(56) References Cited

U.S. PATENT DOCUMENTS 7,164,298 B2 *  1/2007  Sung .......................... 327/112

* cited by examiner

*Primary Examiner*—Robert Pascal
*Assistant Examiner*—Hieu Nguyen
(74) *Attorney, Agent, or Firm*—Jianq Chyun IP Office

(57) ABSTRACT

A device and method for enhancing current driving are provided. The device comprises an operational amplifier, a monitor device, and an auxiliary output device. The monitor device is adopted to monitor whether the non-inverse input signal is close to a maximum or minimum voltage of an input source of the operational amplifier. When the non-inverse input signal is close to the maximum or minimum voltage, the auxiliary output device outputs an auxiliary current to an output terminal of the device of enhancing current driving.

14 Claims, 3 Drawing Sheets

DEVICE AND METHOD FOR ENHANCING OUTPUT CURRENT DRIVING

CROSS-REFERENCE TO RELATED APPLICATION

This application claims the priority benefit of currently-pending Taiwan application Ser. No. 94106399, filed on Mar. 3, 2005. All disclosure of the Taiwan application is incorporated herein by reference.

BACKGROUND OF THE INVENTION

1. Field of the Invention

The present invention relates to a device and method for enhancing output current driving, and more particularly to a device and method for enhancing current driving by using an auxiliary output device to output an auxiliary current.

2. Description of the Related Art

A conventional operational amplifier can be used for amplifying a signal difference between two input signals. Generally, an output voltage of a voltage operational amplifier is equal to a difference between a non-inverse input voltage and an inverse input voltage multiplying a voltage gain of the operational amplifier. An ideal voltage operational amplifier has high input impedance, and its output impedance is near 0. Regarding an operational transconductance amplifier (OTA), its output current is equal to a difference between its non-inverse input voltage and inverse input voltage multiplying a transconductance gain of the operational amplifier. An ideal OTA has high input impedance and a high output impedance.

For a conventional operational amplifier, in order to achieve rail-to-rail effect, when a range of an output voltage is proximately close to a range of an input voltage, and to obtain great current driving, an output stage usually is added after the operational amplifier.

FIG. 1 is a schematic drawing showing a conventional operational amplifier. Referring to FIG. 1, the operational amplifier 100 comprises an OTA 102 and an output stage 104. The non-inverse input voltage of the OTA 102 is V1, and its inverse input voltage is V2. The output stage 104 comprises a pull-push output stage, which is composed of two metal-oxide-semiconductor (MOS) transistors 112 and 114. The output terminal of the OTA 102 is coupled to the input terminal of the output stage 104. The output voltage of the output stage 104 is VO, and coupled to the load 106. The voltage range of the input source of the operational amplifier 102 is between the VDD and ground, 0V. The source of the PMOS transistor 112 of the output stage 104 is coupled to the voltage VDD, and the source of the NMOS transistor 114 is grounded. Due to its high output impedance, the OTA 102 is not adapted for driving the load 106 with low resistance or high capacitance. By using the push-pull output stage 104 to push or pull a current from the load 106, the current driving and the output voltage range are enhanced.

In some applications, the conventional operational amplifier used in a unit gain buffer, however, generates great output offset.

FIG. 2 is a schematic drawing showing an application of a conventional operational amplifier circuit. Referring to FIG. 2, the output terminal of the output stage 104 is coupled to the inverse input terminal of the OTA 102. Generally, this connection method is called negative feedback. For example, if the voltage VO is close to the maximum voltage VDD of the input source, while outputting a great push current to the load 106, a great output offset is created. Traditionally, a method of reducing the output offset is to lower the impedance of the output terminal of the output stage 104 to the positive voltage source VDD, that is, to increase the aspect ratio of the PMOS transistor 112. In addition, if the voltage VO is very close to the minimum voltage 0V of the input power source, while pulling a great pull current from the load 106, a great output offset also is created. A traditional method of reducing the output offset is to lower the impedance of the output stage 104 to the negative voltage source, i.e., the ground terminal, that is, to increase the aspect ratio of the NMOS transistor 114.

Accordingly, if the conventional operational amplifier includes both the rail-to-rail function and great current driving, the aspect ratios of the transistors 112 and 114 of the output stage 104 should be increased. The conventional circuit, however, increases the circuit layout area and also the cost. In addition, it also enhances the steady current flowing from the transistor 112 to the transistor 114 of the output stage 104, causing power loss. Accordingly, an operational amplifier which can achieve the rail-to-rail output, have a great current driving, and reduce the aspect ratio of the transistor and cost without increasing the steady current is desired.

SUMMARY OF THE INVENTION

Accordingly, the present invention is directed to a device of enhancing output current driving for increasing the current driving of the operational amplifier enhanced when outputting maximum or minimum voltage source without wasting additional steady current.

In additional, the present invention also is directed to a method for enhancing output current driving for increasing the current driving of the operational amplifier when outputting maximum or minimum voltage source without wasting additional steady current.

The device of enhancing output current driving comprises an operational amplifier, a monitor device, and an auxiliary output device. The monitor device monitors whether a non-inverse input signal of the operational amplifier is close to a maximum voltage or a minimum voltage of an input source of the operational amplifier. If the non-inverse input signal is close to the maximum voltage or the minimum voltage, the auxiliary device outputs an auxiliary current to an output terminal of the device of enhancing output current driving.

In an embodiment of the present invention, the device of enhancing output current driving further comprises an output stage. Its input terminal is coupled to an output terminal of the operational amplifier. The output stage receives an output signal from the operational amplifier, and outputs a first current to the output terminal according to the output signal.

In an embodiment of the present invention, the output stage comprises a first push device and a first pull device. The first push device pushes a main current to the output terminal, and the first pull device pulls the first current from the output terminal.

In an embodiment of the present invention, the first push device comprises at least one PMOS transistor, its gate receiving the output signal, its source being coupled to a power source, and its drain being coupled to the output terminal.

In an embodiment of the present invention, the first pull device comprises at least one NMOS transistor, its gate receiving the output signal, its source being coupled to a power source, and its drain being coupled to the output terminal.

In an embodiment of the present invention, the auxiliary output device comprises a second push device and a second pull device. When the non-inverse input signal is close to the maximum voltage, the second push device pushes the auxiliary current to the output terminal. When the non-inverse input signal is close to the minimum voltage, the second pull device pulls the auxiliary current from the output terminal.

In an embodiment of the present invention, the second push device comprises at least one PMOS transistor, its gate being coupled to the monitor device, its source being coupled to a power source, and its drain being coupled to the output terminal.

In an embodiment of the present invention, the second pull device comprises at least one NMOS transistor, its gate being coupled to the monitor device, its source being coupled to a power source, and its drain being coupled to the output terminal.

In an embodiment of the present invention, the operational amplifier comprises, for example, a differential amplifier, an operational transconductance amplifier, or a voltage operational amplifier.

The method for enhancing output current driving of the present invention is adapted for an operational amplifier. In this method, it is monitored whether a non-inverse output signal from the operational amplifier is close to a maximum voltage or a minimum voltage of an output source of the operational amplifier. An auxiliary current then is output, if the non-inverse input signal is close to the maximum voltage or the minimum voltage.

In an embodiment of the present invention, the method for enhancing output current driving further comprises outputting a first current to the output terminal according to an output signal of the operational amplifier.

In an embodiment of the present invention, if the non-inverse input signal is close to the maximum voltage, the auxiliary current is pushed to the output terminal; if the non-inverse signal is close to the minimum voltage, the auxiliary current is pulled from the output terminal.

Accordingly, the present invention is related to the device and method to enhance output current driving by using the monitor device and auxiliary output device. In the present invention, the monitor device outputs the auxiliary current to enhance current driving without wasting additional steady current, when the non-inverse signal of the operational amplifier is close to the maximum or minimum voltage of the input source of the operational amplifier. According to the present invention, the rail-to-rail output and great current driving are obtained. The offset of the operational amplifier is reduced without wasting additional steady current.

The above and other features of the present invention will be better understood from the following detailed description of the preferred embodiments of the invention that is provided in communication with the accompanying drawings.

DESCRIPTION OF SOME EMBODIMENTS

Figure 1:
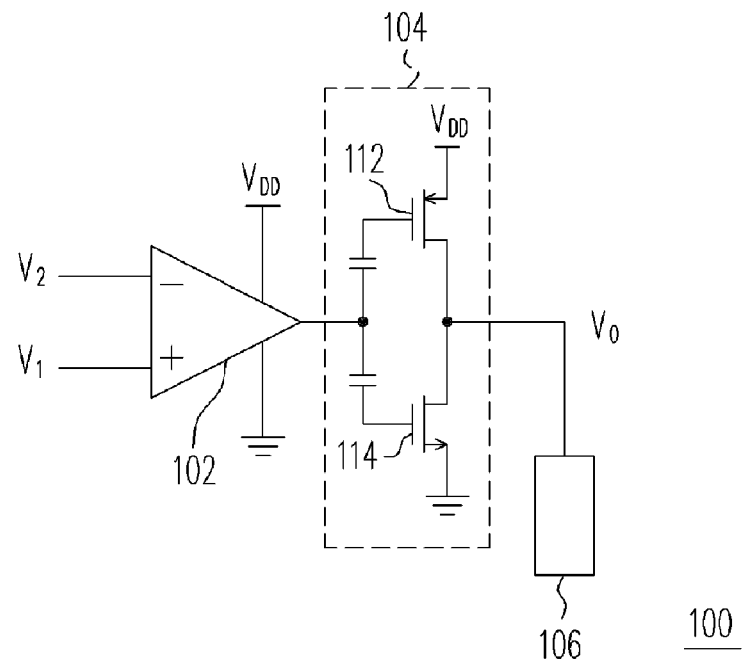
FIG. 1 is a schematic drawing showing a conventional operational amplifier.
Figure 2:
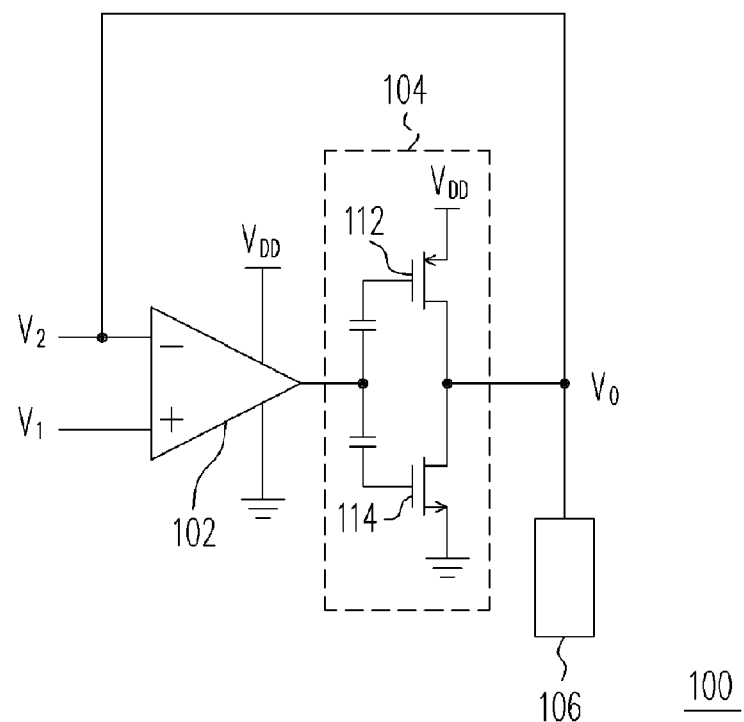
FIG. 2 is a schematic drawing showing an application of a conventional operational amplifier circuit.
Figure 3:
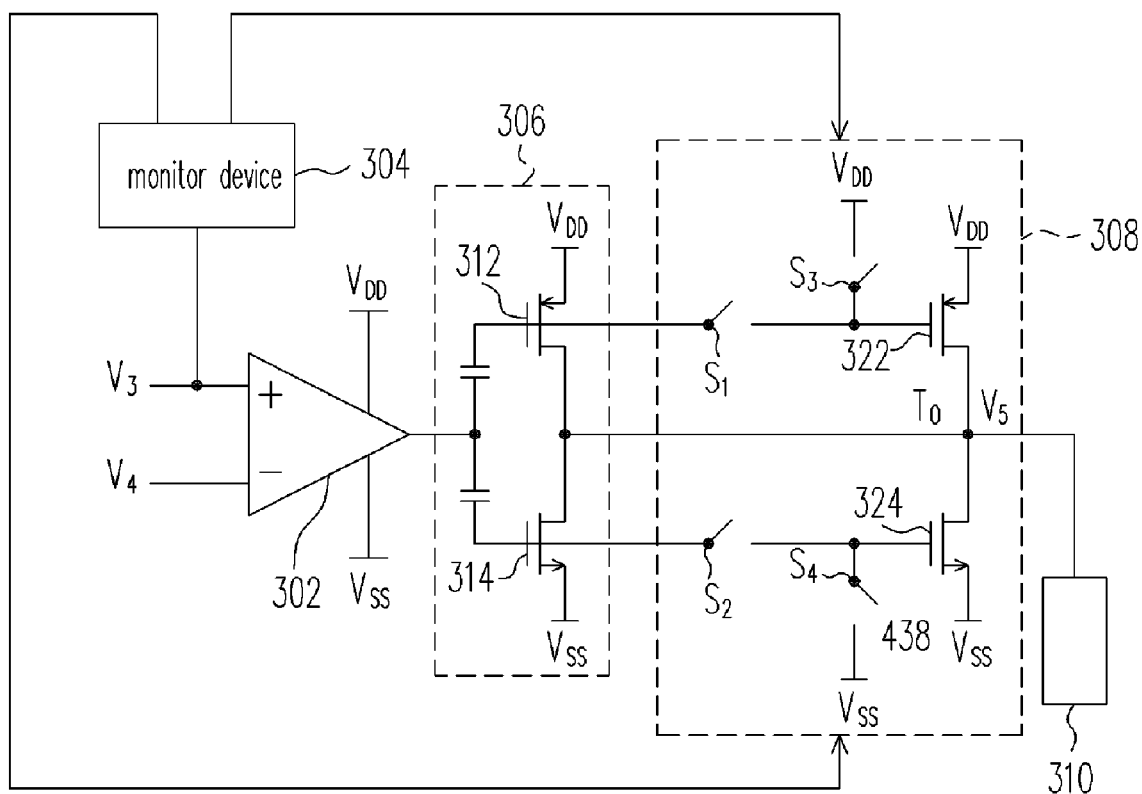
FIG. 3 is a schematic drawing showing a device of enhancing output current driving according to an embodiment of the present invention.

FIG. 3 is a schematic drawing showing a device of enhancing output current driving according to an embodiment of the present invention. Referring to FIG. 3, the device 300 comprises an operational amplifier 302, a monitor device 304, an output stage 306, and an auxiliary output device 308. The non-inverse input signal of the operational amplifier 302 is V3, and the inverse input signal is V4. The output terminal of the operational amplifier 302 is coupled to the input terminal of the output stage 306. In an embodiment of the present invention, the output stage 306 comprises a push-pull circuit, which is composed of the PMOS transistor 312 and the NMOS transistor 314, for example. The source of the PMOS transistor 312 is coupled to the voltage source VDD, and the source of the NMOS transistor 314 is coupled to the voltage source VSS. In an embodiment of the present invention, the auxiliary output device 308 comprises a pull-push circuit, which is composed of the PMOS transistor 322, the NMOS transistor 324, and several switches S1-S4, for example. The source of the PMOS transistor 322 is coupled to the voltage source VDD, and the source of the NMOS transistor 324 is coupled to the voltage source VSS. The switch S1 is coupled between the gate of the PMOS transistor 312 and the gate of the PMOS transistor 322. The switch S2 is coupled between the gate of the NMOS transistor 314 and the gate of the NMOS transistor 324. The switch S3 is coupled between the voltage source VDD and the gate of the PMOS transistor 322. The switch S4 is coupled between the voltage source VSS and the gate of the NMOS transistor 324. The drain of the PMOS transistor 312 and the drain of the NMOS transistor 314 are coupled to the drain of the PMOS transistor 322 and the drain of the NMOS transistor 324, respectively, serving as the output terminal To of the device 300. The output terminal To has a voltage V5, and is coupled to a load 310.

Referring to FIG. 3, in an embodiment of the present invention, the input terminal of the monitor device 304 is coupled to the non-inverse input terminal of the operational amplifier 302. Its output terminal is coupled to the auxiliary output device 308. Accordingly, the monitor device 304 monitors the input status of the operational amplifier 302, thereby controlling the auxiliary output device 308.

Referring to FIG. 3, the maximum voltage of the input source of the operational amplifier 302 can be equal to the voltage source VDD, for example. The minimum voltage can be equal to the voltage source VSS, for example. Note that the maximum voltage and the minimum voltage of the input source of the operational amplifier 302 have various values, and is not limited to the above value. In an embodiment of the present invention, the voltage VSS can be grounded, e.g., 0V, for example.

Referring to FIG. 3, according to an embodiment of the present invention, if the signal V3 is close to the voltage source VDD, the monitor device 304 detects the input signal, and outputs a control signal to the auxiliary output device 308 to turn on the switches S1 and S4. The switches S2 and S3 are off. While the PMOS transistor 312 outputs a current to the load 310, the PMOS transistor 322 is turned on to output an auxiliary current to the load 310. Accordingly, the auxiliary output device 308 enhances the current driving of the output stage 306. In this embodiment, the PMOS transistors 312 and 322 are deemed as parallel connected. As a result, the impendence to the voltage source VDD of the output terminal To is reduced, and the output offset becomes small.

Additionally, in another embodiment of the present invention, if the signal V3 is close to the voltage VSS, the switches S2 and S3 are turned on, but the switches S1 and S4 are off. While the NMOS transistor 314 pulls a current from the load 310, the NMOS transistor 324 is turned on to pull an auxiliary current from the load 310. Accordingly, the auxiliary device 308 enhances the current driving of the output stage 306. In this embodiment, the NMOS transistors 314 and 324 are deemed as parallel connected. As a result, the impendence to the voltage source VDD of the output terminal To is reduced, and the output offset becomes small.

In addition, in another embodiment of the present invention, if the signal V3 is in other input range, the switches S3 and S4 are turned on, and the switches S1 and S2 are off. In this embodiment, the PMOS transistor 322 and the NMOS transistor 324 are in the off state. The output stage 306 functions, but the auxiliary output device 308 does not. Accordingly, the steady current is reduced.

Figure 4:
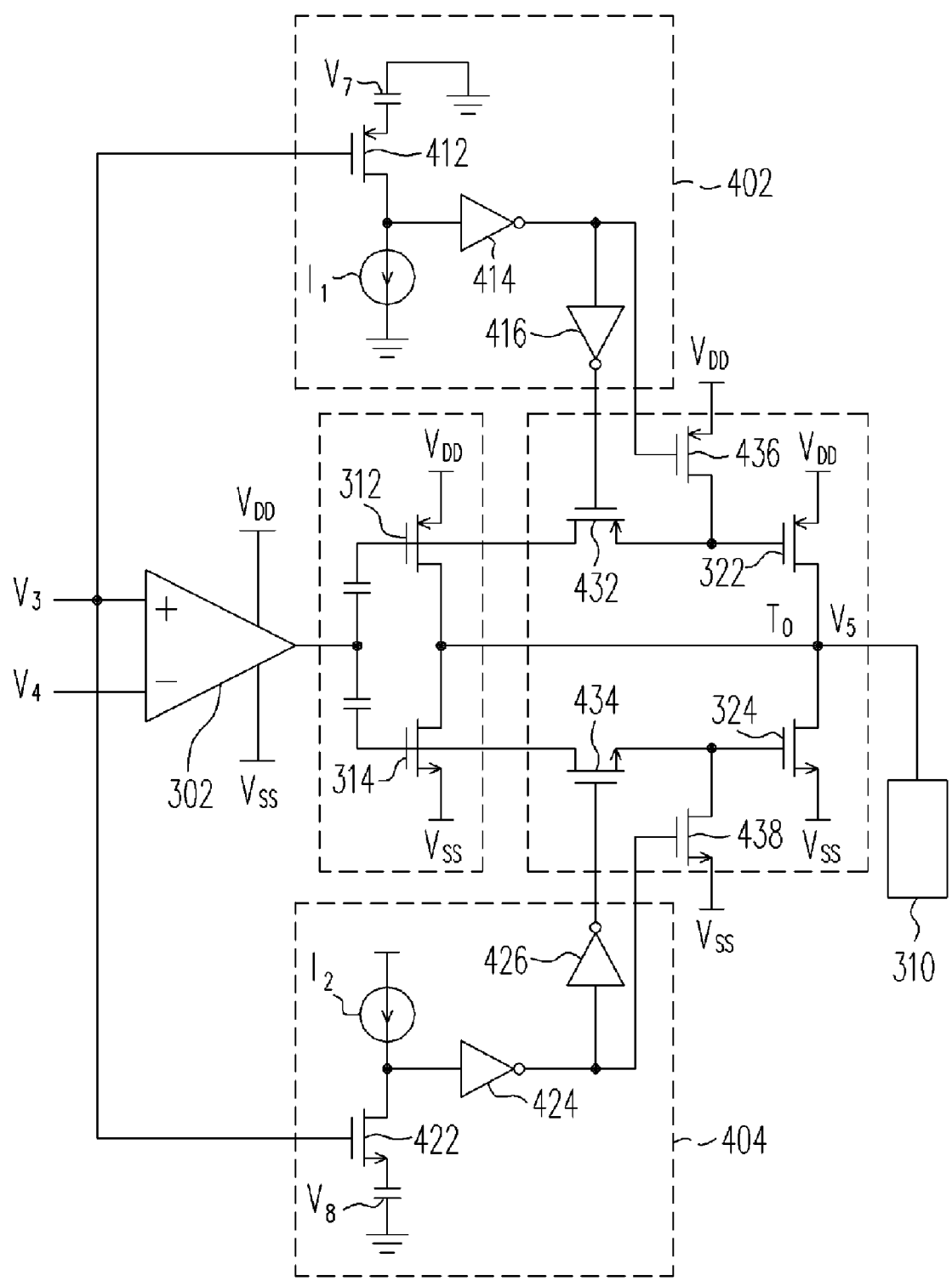
FIG. 4 is a schematic drawing showing a device of enhancing output current driving according to another embodiment of the present invention.

FIG. 4 is a schematic drawing showing a device of enhancing output current driving of another embodiment of the present invention. Note that the switches S1 and S3 in FIG. 3 are equivalent to the PMOS transistors 432 and 436 in FIG. 4, and that the switches S2 and S4 are equivalent to the NMOS transistors 434 and 438. In addition, the auxiliary output device 308 in FIG. 3 comprises the first monitor device 402 and the second monitor device 404 in FIG. 4. Other parts of the device in FIG. 4 are similar to those in FIG. 3.

Referring to FIG. 4, the first monitor device 402 comprises the PMOS transistor 412, the voltage source V7, the current source I1, and the inverters 414 and 416. The gate of the PMOS transistor 412 is coupled to the non-inverse input terminal of the operational amplifier 302. Its source is coupled to the voltage source V7, and its drain is coupled to the current source I1 and the input terminal of the inverter 414. The output terminal of the inverter 414 is coupled to the input terminal of the inverter 416, and the gate of the PMOS transistor 436. The output terminal of the inverter 416 is coupled to the gate of the PMOS transistor 432. In an embodiment of the present invention, the voltage of the voltage source V7 can be equal to the maximum voltage, e.g., VDD, of the input source of the operational amplifier 302. The voltage of the voltage source V7, however, may have different values.

Additionally, the second monitor device 404 comprises the NMOS transistor 422, the voltage source V8, the current source I2, and the inverters 424 and 426. The gate of the NMOS transistor 422 is coupled to the non-inverse input terminal of the operational amplifier 302. Its source is coupled to the voltage source V8, and its drain is coupled to the current source I2 and the input terminal of the inverter 424. The output terminal of the inverter 424 is coupled to the input terminal of the inverter 426, and the gate of the NMOS transistor 438. The output terminal of the inverter 426 is coupled to the gate of the NMOS transistor 434. In an embodiment of the present invention, the voltage of the voltage source V8 can be equal to the minimum voltage, e.g., VSS, of the input source of the operational amplifier 302. The voltage of the voltage source V8, however, may have different values. In an embodiment of the present invention, the voltage source VSS can be grounded, i.e., 0V.

Referring to FIG. 4, according to an embodiment of the present invention, if the current sink of the current source I1 is weak, and the current driving of the PMOS transistor 412 is powerful, then when the non-inverse input signal V3 is close to the maximum voltage of the input source of the operational amplifier, e.g., if the voltage VDD is applied, and V3>V7−Vt1, wherein Vt1 represents the threshold voltage of the PMOS transistor 412, the PMOS transistor 412 is turned off. The input of the inverter 414 is "Low", and its output is "High". The input of the inverter 416 is "High", and its output is "Low".

Similarly, if the current sink of the current source I2 is weak, and the current driving of the NMOS transistor 422 is powerful, then when the non-inverse input signal V3 is close to the voltage VDD, and V3>V8+Vt2, wherein Vt2 represents the threshold voltage of the NMOS transistor 422, the NMOS transistor 422 is turned on. The input of the inverter 424 is "High", and its output is "Low". The input of the inverter 426 is "Low", and its output is "High".

Accordingly, when the signal V3 is close to the voltage VDD, the output of the inverters 414 and 426 are "High", and the output of the inverters 416 and 424 are "Low". The PMOS transistor 432 and the NMOS transistor 438 are turned on, and the PMOS transistor 436 and the NMOS transistor 434 are off. While the PMOS transistor 312 outputs a current to the load 310, the PMOS transistor 322 is turned on to output an auxiliary current to the load 310. Accordingly, the auxiliary output device 308 enhances the current driving of the output stage 306. In this embodiment, the PMOS transistors 312 and 322 are deemed as parallel connected. As a result, the impendence to the voltage source VDD of the output terminal To is reduced, and the output offset becomes small.

Referring to FIG. 4, in an embodiment of the present invention, if the non-inverse input signal V3 is close to the minimum voltage of the input source of the operational amplifier, when the voltage VSS is applied, and V3<V7−Vt1, then the PMOS transistor 412 is turned on. The input of the inverter 414 is "High", and its output is "Low". The input of the inverter 416 is "Low", and its output is "High".

Additionally, if the non-inverse input signal V3 is close to the voltage VSS, and V3<V8+Vt2, wherein Vt2 represents the threshold voltage of the NMOS transistor 422, the NMOS transistor 422 is off. The input of the inverter 424 is "Low", and its output is "High". The input of the inverter 426 is "High", and its output is "Low".

Accordingly, when the signal V3 is close to the voltage VSS, the outputs of the inverters 414 and 426 are "Low", and the outputs of the inverters 416 and 424 are "High". The PMOS transistor 432 and the NMOS transistor 438 are off, and the PMOS transistor 436 and the NMOS transistor 434 are turned on. While the NMOS transistor 314 pulls a current from the load 310, the NMOS transistor 324 is turned on to pull an auxiliary current from the load 310. Accordingly, the auxiliary output device 308 enhances the current driving of the output stage 306. In this embodiment, the NMOS transistors 314 and 324 are deemed as parallel connected. As a result, the impendence to the voltage source VDD of the output terminal To is reduced, and the output offset becomes small.

In another embodiment of the present invention, if V8+Vt2<V3<V7−Vt1, the outputs of the inverters 414 and 424 are "Low", and the outputs of the inverters 416 and 426 are "High". The PMOS transistor 432 and the NMOS transistor 434 are off, and the PMOS transistor 436 and the NMOS transistor 438 are turned on. Since the PMOS transistor 322 and the NMOS transistor 324 are in the off state, the output stage 306 functions, but the auxiliary output device 308 does not. The steady current thus is reduced.

In an embodiment of the present invention, the operational amplifier 302 comprises, for example, a differential amplifier, an operational transconductance amplifier, or a voltage operational amplifier.

Accordingly, the present invention is related to the device and method to enhance output current driving by using the monitor device and auxiliary output device. In the present invention, the monitor device outputs the auxiliary current to enhance current driving without wasting additional steady current, when the non-inverse signal of the operational amplifier is close to the maximum or minimum voltage of the input source of the operational amplifier. According to the present invention, the rail-to-rail output and great current driving are obtained. The offset of the operational amplifier is reduced without wasting additional steady current.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A device of enhancing output current driving, comprising:
    an operational amplifier;
    a monitor device, monitoring whether a non-inverse input signal of the operational amplifier is close to a maximum voltage or a minimum voltage of an input source of the operational amplifier; and
    an auxiliary output device, when the non-inverse input signal is close to the maximum voltage or the minimum voltage, outputting an auxiliary current to an output terminal of the device of enhancing output current driving.

2. The device of enhancing output current driving of claim 1, further comprising:
    an output stage, an input terminal thereof being coupled to an output terminal of the operational amplifier, the output stage receiving an output signal from the operational amplifier, and outputting a first current to the output terminal according to the output signal.

3. The device of enhancing output current driving of claim 2, wherein the output stage comprises a first push device and a first pull device, the first push device pushes a main current to the output terminal, and the first pull device pulls the first current from the output terminal.

4. The device of enhancing output current driving of claim 3, wherein the first push device comprises at least one PMOS transistor, a gate thereof receives the output signal, a source thereof is coupled to a power source, and a drain thereof is coupled to the output terminal.

5. The device of enhancing output current driving of claim 3, wherein the first pull device comprises at least one NMOS transistor, a gate thereof receives the output signal, a source thereof is coupled to a power source, and a drain thereof is coupled to the output terminal.

6. The device of enhancing output current driving of claim 1, wherein the auxiliary output device comprises a second push device and a second pull device, when the non-inverse input signal is close to the maximum voltage, the second push device pushing the auxiliary current to the output terminal; if the non-inverse input signal is close to the minimum voltage, the second pull device pulling the auxiliary current from the output terminal.

7. The device of enhancing output current driving of claim 6, wherein the second push device comprises at least one PMOS transistor, a gate thereof being coupled to the monitor device, a source thereof being coupled to a power source, and a drain thereof being coupled to the output terminal.

8. The device of enhancing output current driving of claim 6, wherein the second pull device comprises at least one NMOS transistor, a gate thereof being coupled to the monitor device, a source thereof being coupled to a power source, and a drain thereof being coupled to the output terminal.

9. The device of enhancing output current driving of claim 1, wherein the operational amplifier comprises a differential amplifier.

10. The device of enhancing output current driving of claim 1, wherein the operational amplifier comprises an operational transconductance amplifier.

11. The device of enhancing output current driving of claim 1, wherein the operational amplifier comprises a voltage operational amplifier.

12. A method for enhancing output current driving, adapted for an operational amplifier, the method comprising:
    monitoring whether an non-inverse output signal from the operational amplifier is close to a maximum voltage or a minimum voltage of an output source of the operational amplifier; and
    outputting an auxiliary current, when the non-inverse input signal is close to the maximum voltage or the minimum voltage.

13. The method for enhancing output current driving of claim 12, further comprising:
    outputting a first current to the output terminal according to an output signal of the operational amplifier.

14. The method for enhancing output current driving of claim 12, wherein when the non-inverse input signal is close to the maximum voltage, the auxiliary current is pushed to the output terminal; if the non-inverse signal is close to the minimum voltage, the auxiliary current is pulled from the output terminal.

* * * * *